United States Patent
Lee et al.

(10) Patent No.: US 10,123,424 B1
(45) Date of Patent: Nov. 6, 2018

(54) PRINTED CIRCUIT BOARD AND DISPLAY DEVICE INCLUDING THE SAME

(71) Applicant: Samsung Display Co. Ltd., Yongin-si, Gyeonggi-do (KR)

(72) Inventors: So Hyun Lee, Hwaseong-si (KR); Dong Cheol Kim, Suwon-si (KR); Min Seop Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/870,129

(22) Filed: Jan. 12, 2018

(30) Foreign Application Priority Data

Aug. 8, 2017 (KR) .................. 10-2017-0100209

(51) Int. Cl.
| | |
|---|---|
| H05K 1/00 | (2006.01) |
| H05K 1/18 | (2006.01) |
| H05K 1/03 | (2006.01) |
| G06K 9/00 | (2006.01) |

(52) U.S. Cl.
CPC ........... H05K 1/181 (2013.01); H05K 1/0393 (2013.01); G06K 9/00006 (2013.01); H05K 2201/10128 (2013.01); H05K 2201/10151 (2013.01)

(58) Field of Classification Search
CPC ................. H05K 1/181; H05K 1/0393; H05K 2201/10151; H05K 2201/10128; G06K 9/00006
USPC .......................................................... 361/749
See application file for complete search history.

(56) References Cited

U.S. PATENT DOCUMENTS

2017/0045918 A1* 2/2017 Han ...................... G06F 1/1684
2017/0300736 A1* 10/2017 Song ................. G06K 9/00033

FOREIGN PATENT DOCUMENTS

KR     10-2017-0020148 A     2/2017

* cited by examiner

*Primary Examiner* — Sherman Ng
(74) *Attorney, Agent, or Firm* — Innovation Counsel LLP

(57) ABSTRACT

Provided are display devices. The display device comprises: a printed circuit board (PCB); an under-panel sheet which is disposed on the PCB and in which a groove recessed from a surface facing the PCB toward an opposite surface is defined; and a sensor which is disposed on the PCB and in the groove, wherein one or more openings are defined in the PCB in plan view, and the PCB comprises a first area and a second area divided by the openings interposed between the first area and the second area, wherein the first area is an area where the sensor is disposed, and the second area is an area where a portion of the under-panel sheet in which the groove is not defined is disposed.

20 Claims, 15 Drawing Sheets

(a)

(b)

PRINTED CIRCUIT BOARD AND DISPLAY DEVICE INCLUDING THE SAME

This application claims the benefit of Korean Patent Application No. 10-2017-0100209, filed on Aug. 8, 2017, in the Korean Intellectual Property Office, the disclosure of which is incorporated herein by reference in its entirety.

BACKGROUND

1. Field

The present inventive concept relates to a printed circuit board (PCB) and a display device including the same.

2. Description of the Related Art

Electronic devices that provide images to users, such as a smartphone, a digital camera, a notebook computer, a navigation system and a smart TV, include a display device for displaying images.

In a display device, a sensor such as an optical fingerprint sensor may be embedded under a display panel. The optical fingerprint sensor can perform a light receiving/outputting function through a hole formed in an under-panel sheet.

Recently, attempts have been made to embed a sensor in a display device by mounting the sensor directly on a printed circuit board (PCB). In this case, however, the height difference between the sensor and an under-panel sheet disposed around the sensor may cause a difference in weight. The difference in weight can reduce the adhesion between elements or can damage the PCB.

SUMMARY

Aspects of the inventive concept provide a printed circuit board (PCB) capable of reducing a difference in weight due to a height difference between a sensor and an under-panel sheet and a display device including the PCB.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to an aspect of the inventive concept, there is provided a display device comprising: a printed circuit board (PCB); an under-panel sheet which is disposed on the PCB, the under-panel sheet including a main portion and a groove recessed from a surface facing the PCB toward an opposite surface; and a sensor which is disposed on the PCB in the groove, wherein the PCB includes a first area on which the sensor is disposed, a second area surrounding the first area and a connecting portion disposed between the first area and the second area, the connecting portion including at least one opening.

According to another aspect of the inventive concept, there is provided a display device comprising: a PCB; an under-panel sheet which is disposed on the PCB, the under-panel sheet including a groove recessed from a surface facing the PCB toward an opposite surface; a display panel which is disposed on the under-panel sheet; and a sensor which is disposed on the PCB in the groove, wherein the PCB comprises, in plan view, a first area on which the sensor is disposed; a second area surrounding the first area; and a connecting portion which is disposed between the first area and the second area, the connecting portion being thinner than the first area and/or the second area.

According to another aspect of the inventive concept, there is provided a display device comprising: a PCB including a first area, a second area surrounding the first area, and a connecting portion disposed between the first area and the second area; a sensor which is disposed on the first area; and an under-panel sheet which is disposed on the PCB, the under-panel sheet including a groove disposed on the first area to receive the sensor, wherein the connecting portions are thinner than the first area and/or the second area.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
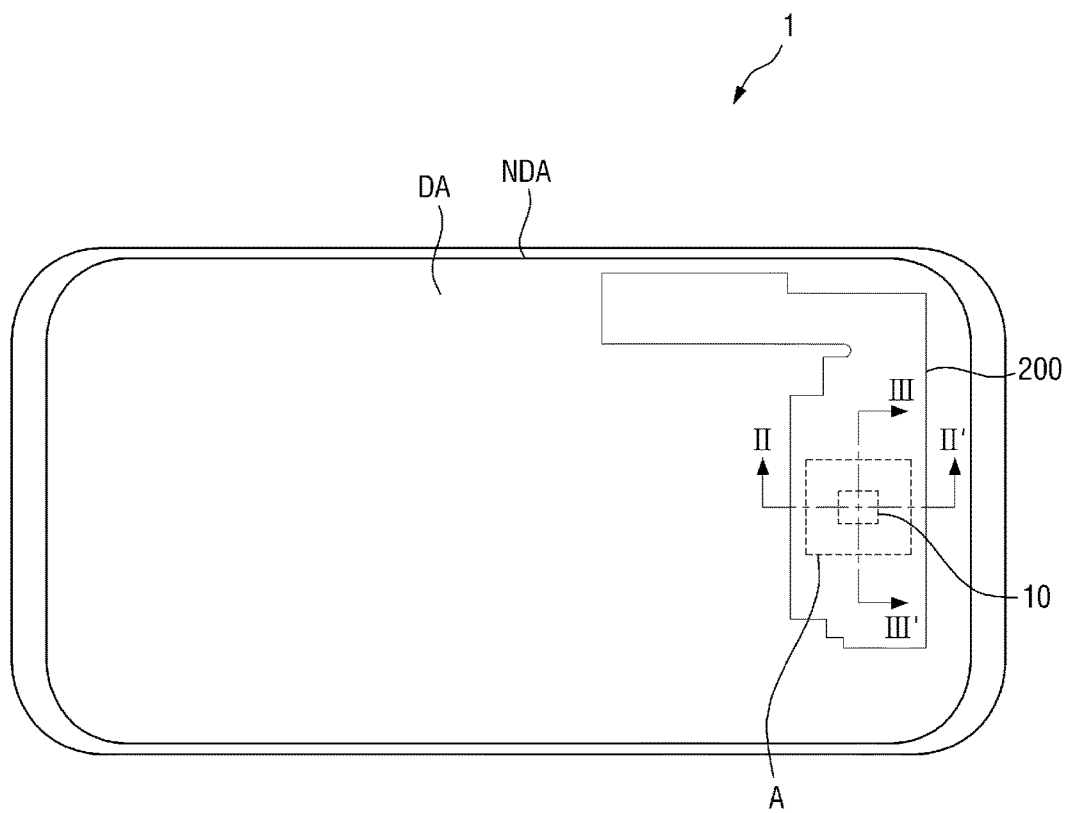
FIG. 1 is a plan vie of a display device according to an embodiment.

Features of the inventive concept and methods of accomplishing the same may be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof, "At least one" is not to be construed as limiting "a" or "an." "Or" means "and/or." As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

Hereinafter, embodiments of the inventive concept will be described with reference to the accompanying drawings.

FIG. 1 is a plan view of a display device 1 according to an embodiment. In the drawing, a portable terminal is illustrated as the display device 1. The portable terminal may be a tablet PC, a smartphone, a personal digital assistant (PDA), a wearable electronic device, or the like. However, the display device 1 according to the embodiment is not necessarily applied to the above examples and can also be applied to large electronic devices such as a television and an external billboard as well as to small and medium-sized electronic devices such as a personal computer, a notebook computer, a car navigation device and a camera. That is, the display device 1 according to the embodiment can be applied to other electronic devices without departing from the spirit of the inventive concept.

Referring to FIG. 1, the display device 1 includes a display area DA and a non-display area NDA in plan view. The display area DA is an area where an image is displayed, and the non-display area NDA is an area where the image is not displayed. The non-display area NDA is disposed around the display area DA. For example, when the display area DA is rectangular, the non-display area NDA may be disposed along four sides of the display area DA.

In the display device 1, a PCB (PCB) 200 is disposed. The PCB 200 may be a control board which provides a signal required for driving a display panel 400 to the display panel 400. The PCB 200 may include circuits, wiring, and the like to transmit signals.

The PCB 200 may be a flexible PCB (FPCB) having flexibility. A case where the PCB 200 is an FPCB will hereinafter be described, but the scope of the inventive concept is not limited to this case.

A sensor 10 is disposed on the PCB 200. Specifically, the sensor 10 may be directly mounted on the PCB 200 using, but not limited to, surface-mount technology.

In some embodiments, the PCB 200 and the sensor 10 may be disposed on one short side of the display device 1 in plan view.

The display device 1 according to the embodiment will now be described in more detail with reference to cross-sectional views and the like.

Figure 2:
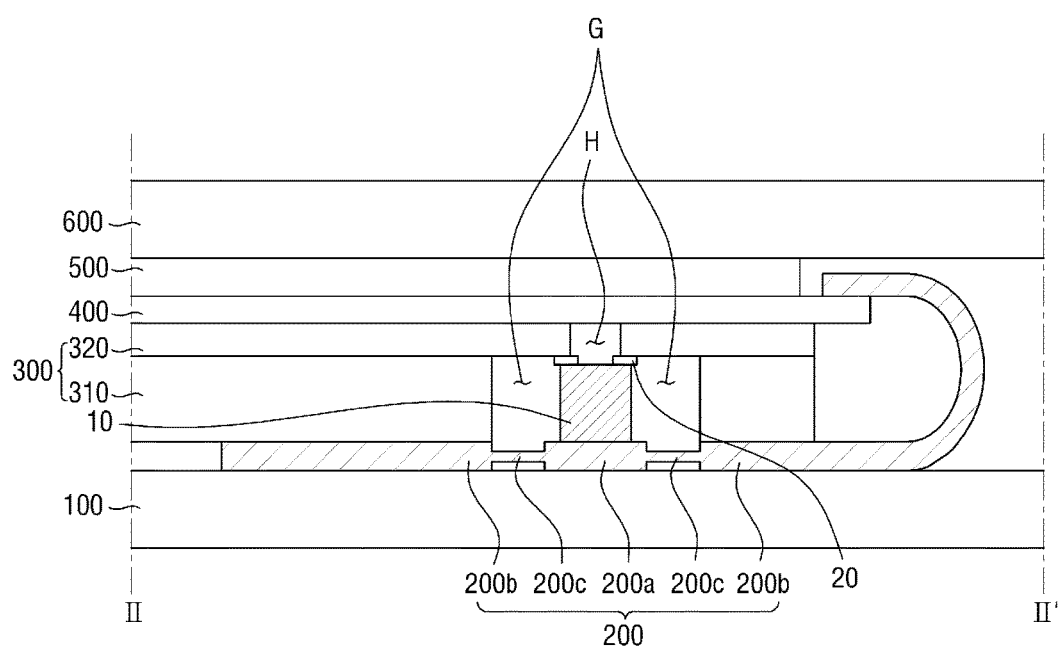
FIG. 2 is a cross-sectional view taken along the line II-II' of FIG. 1.
Figure 3:
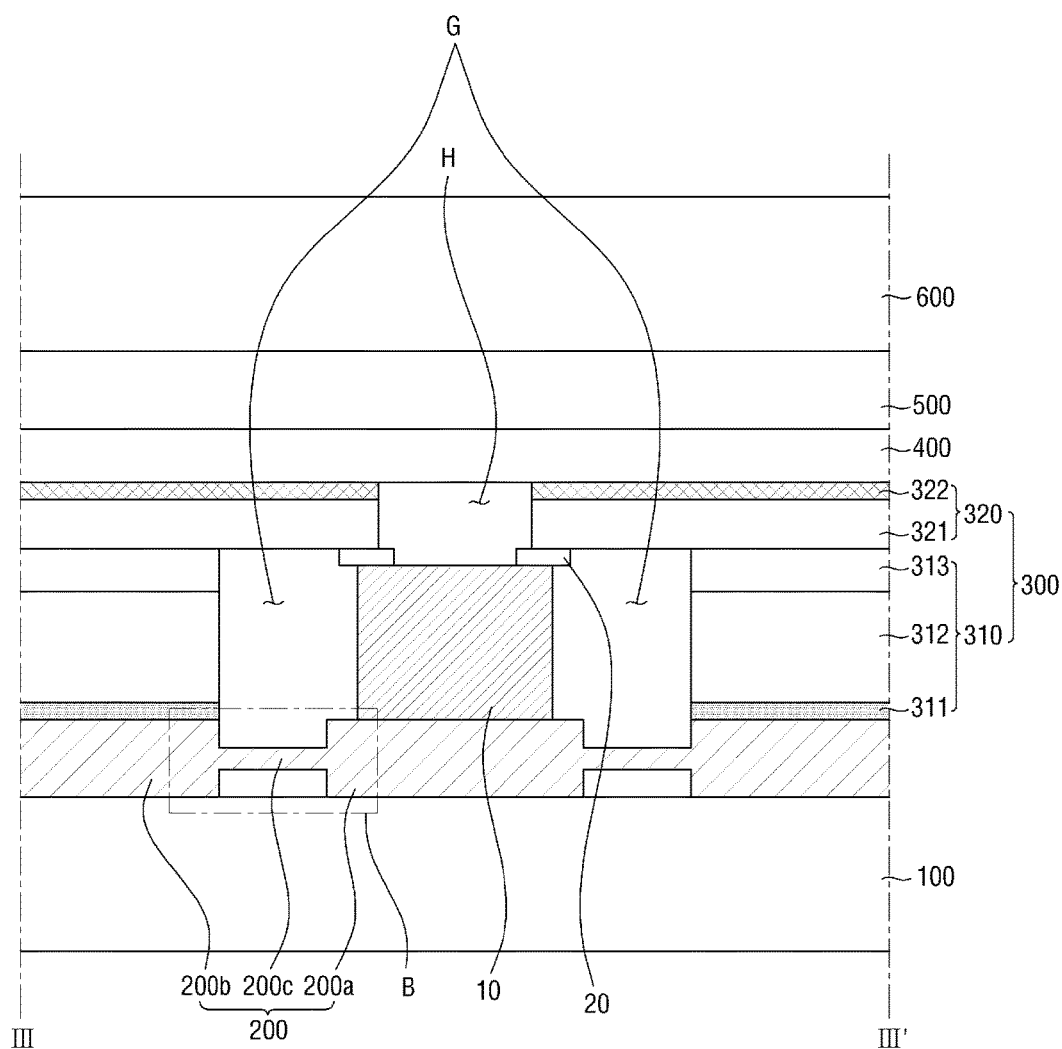
FIG. 3 is a cross-sectional vies taken along the line III-III' of FIG. 1.
Figure 4:
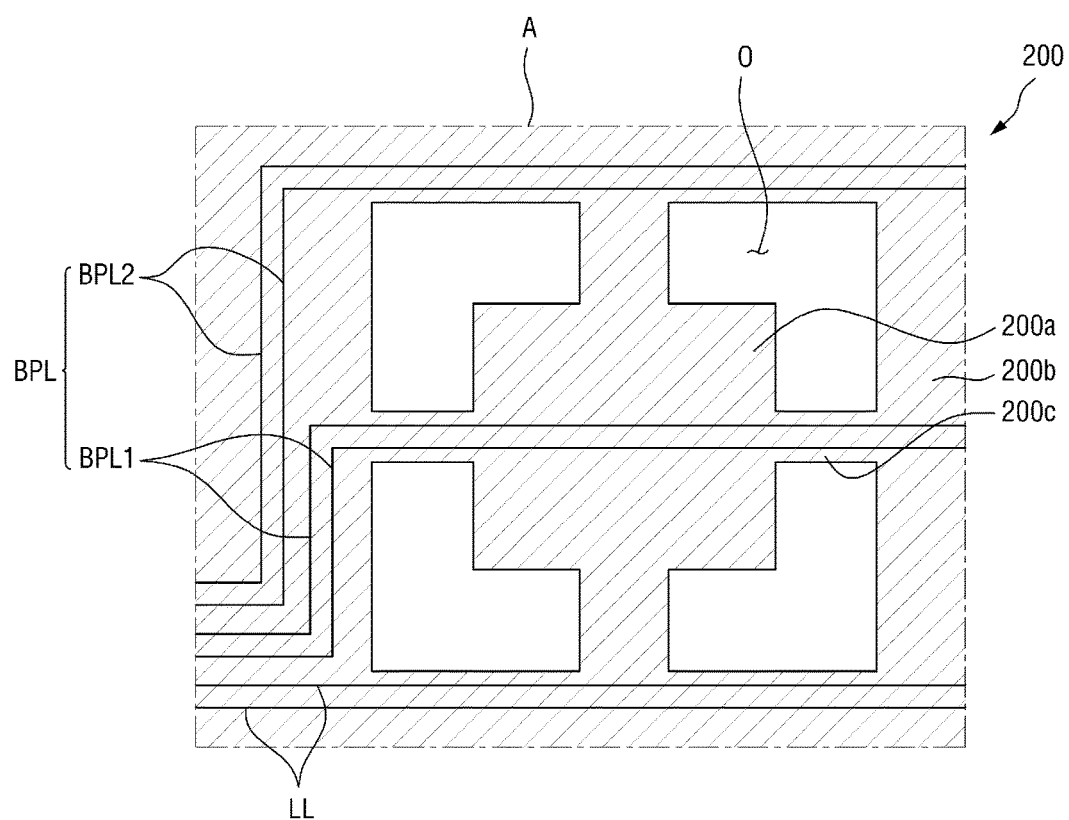
FIG. 4 is an enlarged view of a portion A of a printed circuit board (PCB) illustrated in FIG. 1.
Figure 5:
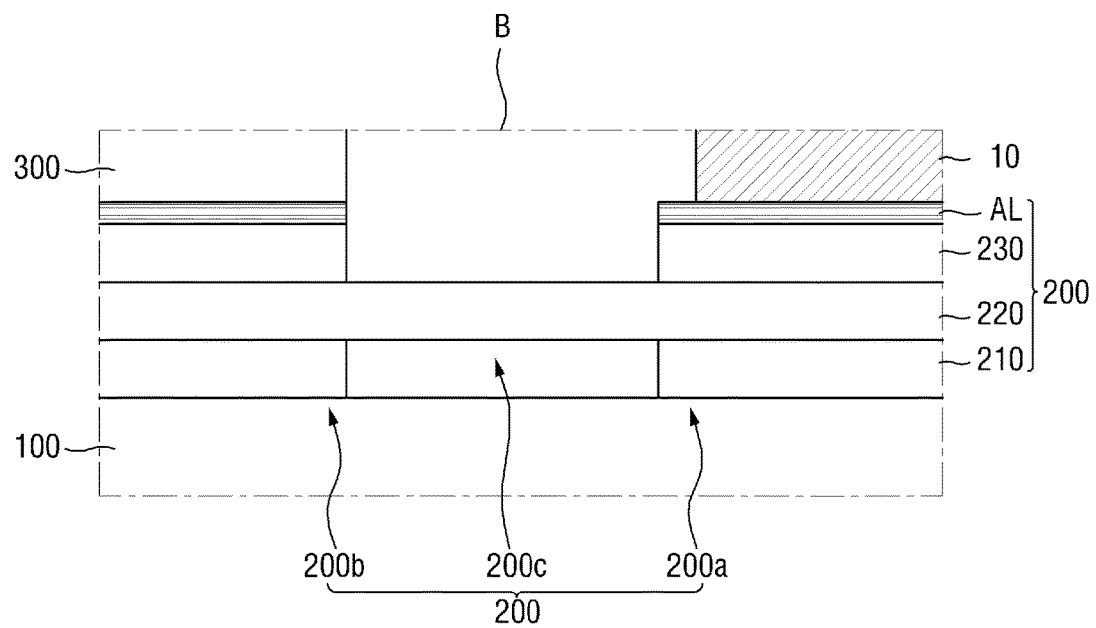
FIG. 5 is an enlarged view of a portion B in FIG. 3.

FIG. 2 is a cross-sectional view taken along the line II-II' of FIG. 1. FIG. 3 is a cross-sectional view taken along the line III-III' of FIG. 1. FIG. 4 is an enlarged view of a portion A of the PCB 200 illustrated in FIG. 1. FIG. 5 is an enlarged view of a portion B in FIG. 3.

Referring to FIGS. 2 and 3, the display device 1 includes a bracket 100, the PCB 200 disposed on the bracket 100, the sensor 10 and an under-panel sheet 300 disposed on the PCB 200, the display panel 400 disposed on the under-panel sheet 300, and a window 600 disposed on the display panel 400.

Unless otherwise defined, the terms "on," "top," and "upper surface" used herein denote a display surface side of the display device 1, and the terms "under," "bottom," and "lower surface" used herein denote an opposite side of the display device 1 from the display surface side.

The bracket 100 protects internal elements of the display device 1, which are disposed on the bracket 100, from an impact from the outside. The bracket 100 may be shaped like a quadrilateral plate having a receiving area. That is, the bracket 100 may include four side surfaces and a bottom surface, and the PCB 200, the sensor 10, the display panel 400, etc. may be disposed in an internal space formed by the four side surfaces and bottom surface of the bracket 100.

In an embodiment, the bracket 100 may form an exterior of the display device 1. A separate housing (not illustrated) can also be coupled to the bracket 100 to form an exterior of the display device 1.

The PCB 200 is disposed on the bracket 100. The PCB 200 may not be fixed or attached to the bracket 100. Therefore, the PCB 200 may have certain mobility in a vertical direction. This will be described in more detail later.

The PCB 200 includes a first area 200a, a second area 200b separated from the first area 200a, and one or more connecting portions 200c connecting the first area 200a and the second area 200b. The connecting portions 200c may be connected to side surfaces of the first area 200a and the second area 200b. The connecting portions 200c may be thinner than the first area 200a and the second area 200b.

Referring to FIG. 4, the second area 200b may surround the first area 200a in plan view. The connecting portions 200c may be disposed between the first area 200a and the second area 200b and connected to both the first area 200a and the second area 200b. In the drawing, the second area 200b covers all sides of the first area 200a. However, the second area 200b does not necessarily cover all sides of the first area 200a and can cover at least one side of the first area 200a. In addition, although a plurality of connecting portions 200c are illustrated in the drawing, only one connecting portion 200c can be provided.

An outer edge of the first area 200a and an inner edge of the second area 200b may be rectangular in plan view. However, the outer edge of the first area 200a and the inner edge of the second area 200b are not necessarily rectangular and can have various shapes such as a polygonal shape and a curved shape.

Between the first area 200a and the second area 200b, one or more openings O may be disposed. The openings O may be spaces defined by the first area 200a, the second area 200b, and the connecting portions 200c in which PCB forming material is removed. Specifically, the first area 200a may be an inner area surrounded by one or more openings O, and the second area 200b may be an outer area which surrounds the inner area and the one or more openings O. Although a plurality of openings O are illustrated in the drawing, the inventive concept is not limited to this case. For example, when one connecting portion 200c is provided, only one opening O may be defined.

The first area 200a and the second area 200b may be portions where the sensor 10 and the under-panel sheet 300 are disposed, respectively. The connecting portions 200c may be integrated with at least part of each of the first area 200a and the second area 200b. This will be described in more detail later.

The PCB 200 may include a plurality of signal lines LL and BPL that can transmit electrical signals. Specifically, the PCB 200 may include a linear line LL and bypass lines BPL. The linear line LL may extend straight in plan view, and the bypass lines BPL may bypass areas in which the openings O are defined.

Since some lines cannot extend straight due to the openings O defined on their paths, they may be placed to bypass one or more openings O as in the case of the bypass lines BPL.

The bypass lines BPL may include a first bypass line BPL1 which extends from a first side (a left side in the drawing) of the second area 200b to a second side (a right side in the drawing) via the connecting portions 200c and the first area 200a by bypassing some openings O and a second bypass line BPL2 which extends from the first side (the left side in the drawing) of the second area 200b to the second side (the right side in the drawing) by completely bypassing the first area 200a and the areas in which the openings O are defined. That is, unlike the linear line LL or the second bypass line BPL2, the first bypass line BPL1 may pass through the first area 200a and the connecting portions 200c.

Referring to FIG. 5, the PCB 200 may be formed by stacking a plurality of unit layers 210, 220 and 230. Although the PCB 200 includes a stack of three unit layers 210, 220 and 230 in the drawing, the number of unit layers 210, 220 and 230 is not limited to three.

The unit layers 210, 220 and 230 may constitute a basic unit of the PCB 200 and may include one or more of a copper layer and a polymer base layer. Although not illustrated in the drawing, a separate adhesive layer may be interposed between the unit layers 210, 220 and 230 to attach and fix the adjacent unit layers 210, 220 and 230 to each other.

The PCB 200 may further include an adhesive layer AL disposed on the unit layers 210, 220 and 230. The sensor 10 and the under-panel sheet 300 disposed on the PCB 200 as described above may be attached to the PCB 200 by the adhesive layer AL.

The connecting portions 200c may be formed of some layers of the PCB 200 which extend from the first area 200a to the second area 200b (or from the second area 200b to the first area 200a). That is, the connecting portions 200c may be portions integrated with the second unit layer 220 of the first area 200a and the second area 200b as illustrated in the drawing. Since only some (e.g., 220) of the unit layers 210, 220 and 230 included in the first area 200a and the second area 200b form the connecting portions 200c, the connecting portions 200c may be thinner than the first area 200a and the second area 200b.

Referring again to FIGS. 2 and 3, the sensor 10 and the under-panel sheet 300 are disposed on the PCB 200. A groove G and a hole H are formed in the under-panel sheet 300. The groove G is recessed from a surface (a lower surface in the drawing) facing the PCB 200 toward an opposite surface (an upper surface in the drawing) and the hole H is formed at a center of the groove G. The hole H may overlap the first area 200a of the PCB 200 and the groove G may overlap the first area 200a and the connecting portion of the PCB 200 in plan view. The sensor 10 may be disposed on the first area 200a of the PCB 200 in the groove G of the under-panel sheet 300. That is, the groove G of the under-panel sheet 300 may be a space in which the sensor 10 can be accommodated.

The sensor 10 may be disposed on the first area 200a of the PCB 200 as described above, and a portion of the under-panel sheet 300 where the groove G is not formed may overlap the second area 200b of the PCB 200 in plan view. While the PCB 200 is disposed on only one side of the display device 1 in plan view as illustrated in the drawing, the under-panel sheet 300 can be disposed in almost the entire area of the display device 1. Therefore, some areas of the under-panel sheet 300 may not be covered by the PCB 200. However, the inventive concept is not limited to this case.

In the drawing, a circumference of the groove G coincides with a border between the connecting portion 200c and the second area 200b of the PCB 200. However, the inventive concept is not limited to this case, and the circumference of the groove G can be located slightly inner or outer sides of the border between the connecting portion 200c and the second area 200b of the PCB 200. That is, a circumference of the groove G may be disposed on the second area 200b of the PCB 200 or the connecting portion 200C of the PCB 200

As described above, the sensor 10 and the under-panel sheet 300 may be respectively attached to the first area 200a and the second area 200b by the adhesive layer AL included in the PCB 200. The sensor 10 can be directly mounted on the first area 200a using the surface mount technology as described above.

The sensor 10 may be an optical sensor that performs a sensing function using light. A through hole H may further be defined in the under-panel sheet 300 and may be disposed on the sensor 10. The through hole H may be a light-transmitting hole that allows light to enter/leave the sensor 10.

Specifically, the sensor 10 may be an optical fingerprint sensor. However, the sensor 10 is not limited to the optical fingerprint sensor and may also be an optical sensor such as an illuminance sensor, a motion sensor, and an infrared sensor.

The under-panel sheet 300 may be attached to a lower surface of the display panel 400 to perform a buffering function for protecting the display panel 400 from external impact and a heat dissipation function for releasing heat generated from the display panel 400 to the outside. Furthermore, the under-panel sheet 300 may perform an electromagnetic wave shielding function, a pattern detection preventing function, a grounding function, a strength enhancing function, and/or a digitizing function.

The under-panel sheet 300 may include a lower layer 310 and an upper layer 320. The lower layer 310 may be a layer in which the recess G is formed to accommodate the sensor 10, and the upper layer 320 may be a layer in which a hole H is defined.

An adhesive member 20 may be disposed between the upper layer 320 of the under-panel sheet 300 and the sensor 10. Specifically, the adhesive member 20 may be disposed between a lower surface of the upper layer 320 exposed by the groove G and an upper surface of the sensor 10, thereby bonding the under-panel sheet 300 and the sensor 10 together.

Although the adhesive member 20 is disposed only on an edge portion of the upper surface of the sensor 10 in the drawing, the inventive concept is not limited to this case. The adhesive member 20 can also be placed to cover the entire upper surface of the sensor 10. The adhesive member 20 may be made of, but not limited to, adhesive or sticky resin.

The lower layer 310 and the upper layer 320 may include layers having the above-described functions of the under-panel sheet 300. The functional layers can be provided in various forms such as layers, membranes, films, sheets, plates, and panels.

In some embodiments, the lower layer 310 may be a layer in which a heat dissipation layer 312 and a cushion layer 313 are stacked, and the upper layer 320 may be a layer in which a digitizing layer 321 and a black tape layer 322 are stacked. However, the order of the layers stacked in the lower layer 310 or the upper layer 320 can be altered, or the layers included in the lower layer 310 and the layers included in the upper layer 320 can be interchanged with each other. Alternatively, some of the above-described layers 312, 313, 321 and 322 can be omitted from the lower layer 310 and/or the upper layer 320, or the lower layer 310 and/or the upper layer 320 can further include layers other than the above-described layers 312, 313, 321 and 322. That is, it should be understood that the lower layer 310 and the upper layer 320 are distinguished from each other not by their functions but by their relative positions or positional relationship.

The lower layer 310 may further include a spacer 311. The spacer 311 may be included to compensate a height difference between the sensor 10 and the lower layer 310 of the under-panel sheet 300. However, since the PCB 200 according to the inventive concept can secure vertical flexibility as will described later, the spacer 311 can be omitted.

The display panel 400 is disposed on the under-panel sheet 300. The display panel 400 is a panel for displaying an image. For example, the display panel 400 may be an organic light-emitting display panel. However, other types of display panels such as a liquid crystal display panel and an electrophoretic panel can also be applied as the display panel 400.

The display panel 400 may include a plurality of organic light-emitting elements disposed on a substrate. The substrate may be a rigid substrate made of, e.g., glass or a flexible substrate made of, e.g., polyimide. When a polyimide substrate is used as the substrate, the display panel 400 can be curved, bent, folded or rolled.

The window 600 is disposed on the display panel 400. The window 600 protects the display panel 400 from external impact while transmitting light emitted from the display panel 400. The window 600 may be made of a transparent material such as glass or resin. The window 600 may overlap the display panel 400 and cover the entire surface of the display panel 400.

In some embodiments, a touch panel 500 may be disposed between the display panel 400 and the window 600. The touch panel 500 may have substantially the same size as the display panel 400 and may overlap the display panel 400. The display panel 400 and the touch panel 500 may be bonded together by an optically clear adhesive (OCA) or an optically clear resin (OCR), and the touch panel 500 and the window 600 may be bonded together by the OCA or the OCR. The touch panel 500 can be omitted. In this case, the display panel 400 and the window 600 may be bonded together by the OCA or the OCR. In some embodiments, the display panel 400 may further include a touch electrode.

The PCB 200 may be an FPCB as described above. Therefore, the PCB 200 can be extended further outward than the under-panel sheet 300 and can be bent such that an end of the PCB 200 is connected to a portion of the display panel 400 disposed above the PCB 200.

As described above, the PCB 200 of the inventive concept includes the first area 200a on which the sensor 10 is disposed, the second area 200b on which the under-panel sheet 300 is disposed, and a connecting portions 200c connecting the first area 200a and the second area 200b. Since the first area 200a and the second area 200b are connected only by the connecting portions 200c which is thinner than the first area 200a and the second area 200b, the PCB 200 may secure flexibility in the vertical direction. This will now be described in detail with reference to FIG. 6.

Figure 6:
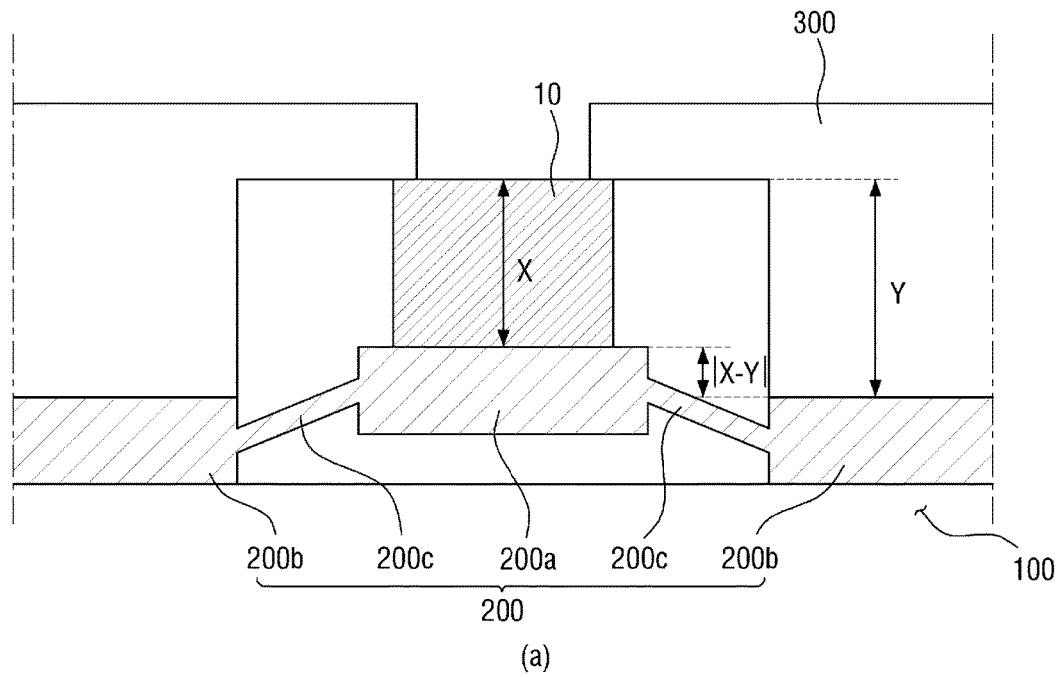
FIG. 6 schematically illustrates the principle that the PCB according to an embodiment has flexibility in a vertical direction.
Figure 6:
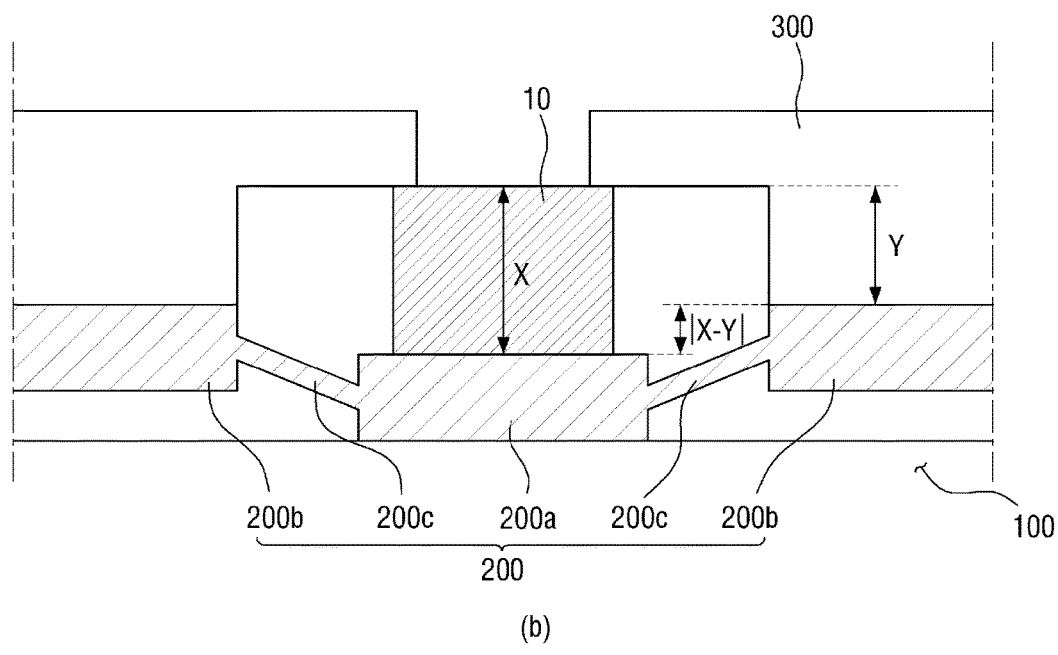

FIG. 6 schematically illustrates the principle that the PCB 200 according to an embodiment has flexibility in the vertical direction.

Referring to FIG. 6A, when a height X of the sensor 10 is smaller than a height Y of the lower layer 310 of the under-panel sheet 300, the first area 200a on which the sensor 10 is disposed moves upward to be higher than the second area 200b on which the under-panel sheet 300 is disposed. Therefore, the height difference between the sensor 10 and the under-panel sheet 300 can be compensated. Since the first area 200a is connected to the second area 200b only by the thin connection portions 200c, it can flexibly move upward.

While the first area 200a on which the sensor 10 is disposed has been lifted upward by a tolerance, the second area 200b on which the under-panel sheet 300 is disposed may be in direct contact with an underlying base surface, specifically, an upper surface of the bracket 100 even when the thickness of the sensor 10 is smaller than the height Y of the lower layer 310 of the under-panel sheet 300. Accordingly, the second area 200b of the PCB 200 may be attached to the bracket 100, and an adhesive member for attaching the second area 200b to the bracket 100 may be interposed between the second area 200b and the bracket 100. However, the inventive concept is not limited to this case, and the second area 200b may also not be attached to the upper surface of the bracket 100.

Referring to FIG. 6B, when the height X of the sensor 10 is greater than the height Y of the lower layer 310 of the under-panel sheet 300, the second area 200b on which the under-panel sheet 300 is disposed may move upward to be higher than the first area 200a on which the sensor 10 is disposed. Therefore, the height difference between the sensor 10 and the under-panel sheet 300 can be compensated. Likewise, since the second area 200b is connected to the first area 200a only by the thin connecting portions 200c, it can flexibly move upward.

While the second area 200b on which the under-panel sheet 300 is disposed has been lifted upward by a tolerance, the first area 200a on which the sensor 10 is disposed may be in direct contact with the underlying base surface, specifically, the upper surface of the bracket 100. Accordingly, the first area 200a of the PCB 200 may be attached to the bracket 100, and an adhesive member for attaching the first area 200a to the bracket 100 may be interposed between the first area 200a and the bracket 100. However, the inventive concept is not limited to this case, and the first area 200a may also not be attached to the upper surface of the bracket 100.

Since the first area 200a and the second area 200b of the PCB 200 of the inventive concept can move in the vertical direction with a certain degree of freedom as described above, the tolerance (|X-Y|) between the sensor 10 and the lower layer 310 may increase. The increased tolerance can prevent portions of the sensor 10 and the under-panel sheet 300 attached to each other from being detached due to a step difference or prevent portions of the under-panel sheet 300 and the display panel 400 attached to each other from being detached due to a step difference. In addition, when the PCB 200 is an FPCB, its mobility may be greater.

Figure 7:
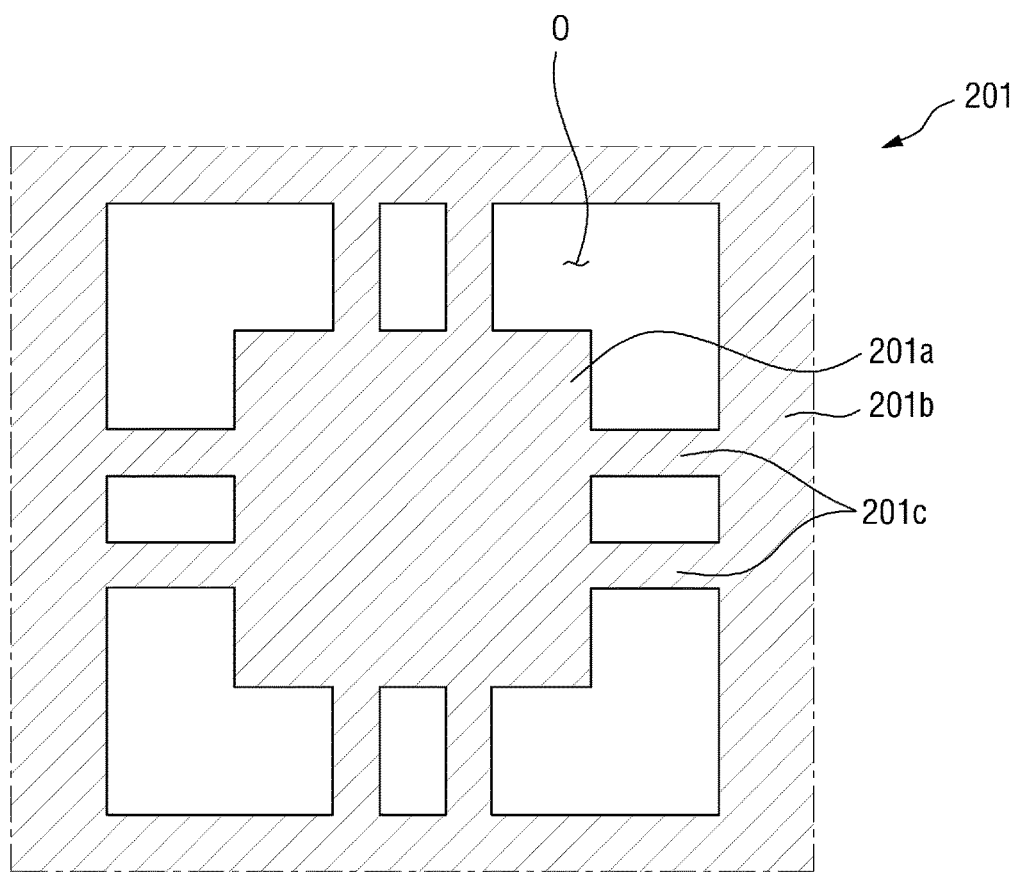
FIGS. 7, 8 and 9 are plan views of PCBs according to embodiments.
Figure 8:
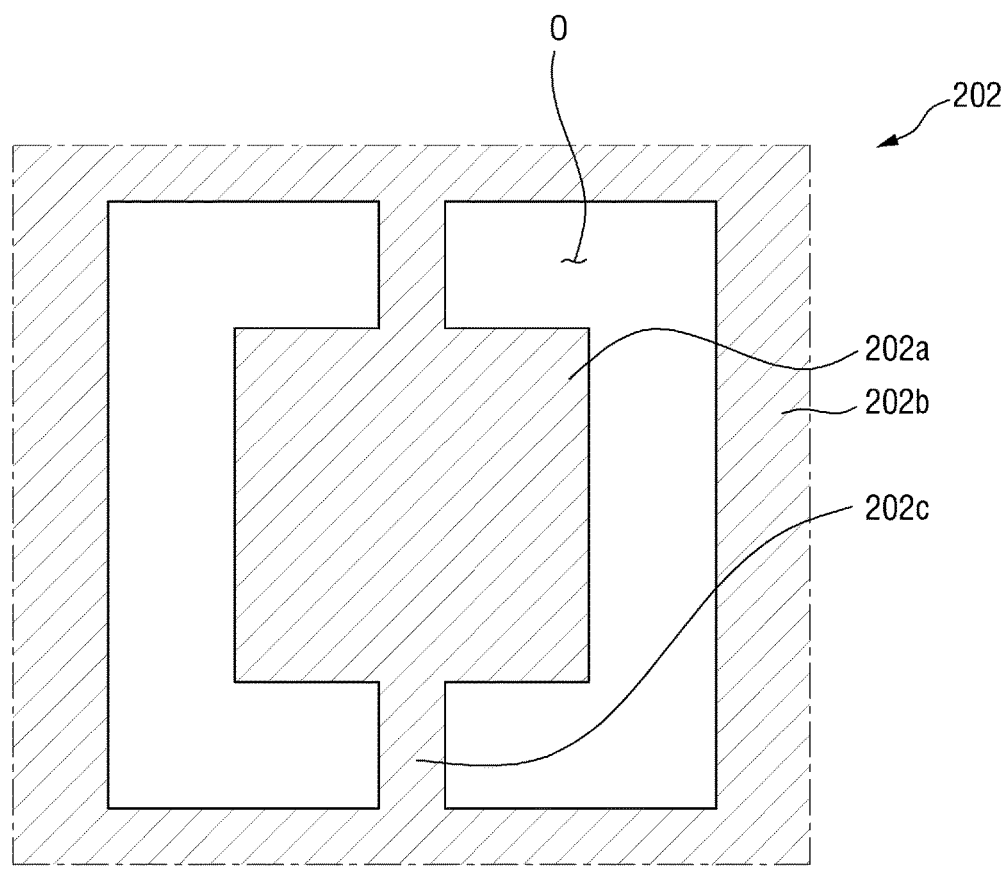
Figure 9:
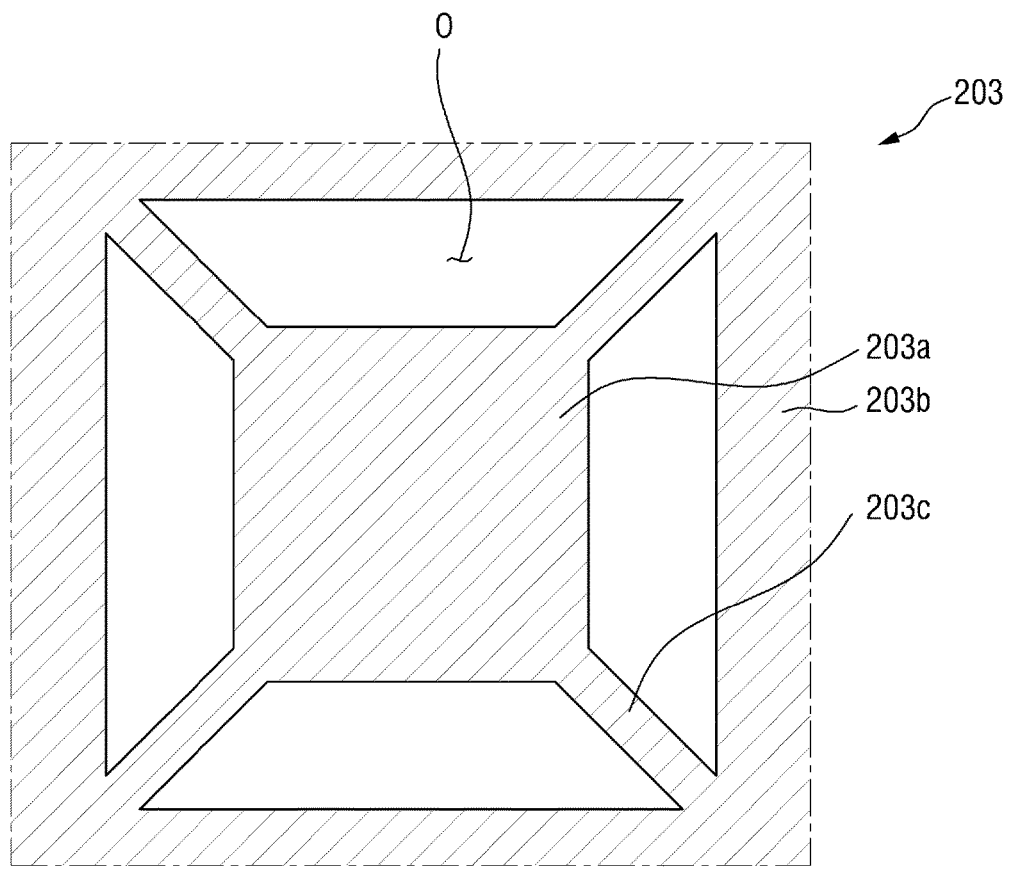

FIGS. 7 through 9 are plan views of PCBs 201, 202 and 203 according to embodiments. The PCBs 201, 202 and 203 of FIGS. 7 through 9 are the same as that of FIG. 4 except for the number and arrangement of connecting portions 201c, 202c and 203c. In FIGS. 7 through 9, signal lines are omitted for the sake of convenience. Hereinafter, any redundant description will be omitted, and the current embodiments will be described, focusing mainly on differences with the pervious embodiment.

Referring to FIG. 7, each pair of corresponding sides of a first area 201a and a second area 201b may be connected by two connecting portions 201c. Referring to FIG. 8, a connecting portion 202c may be formed only for two opposing pairs of corresponding sides of a first area 202a and a second area 202b. Referring to FIG. 9, each connecting portion 203c may be formed to connect vertexes of a first area 203a and a second area 203b.

As apparent from the above description, the connecting portions 201c, 202c, and 203c can have various shapes and can be placed at various positions as desired.

Figure 10:
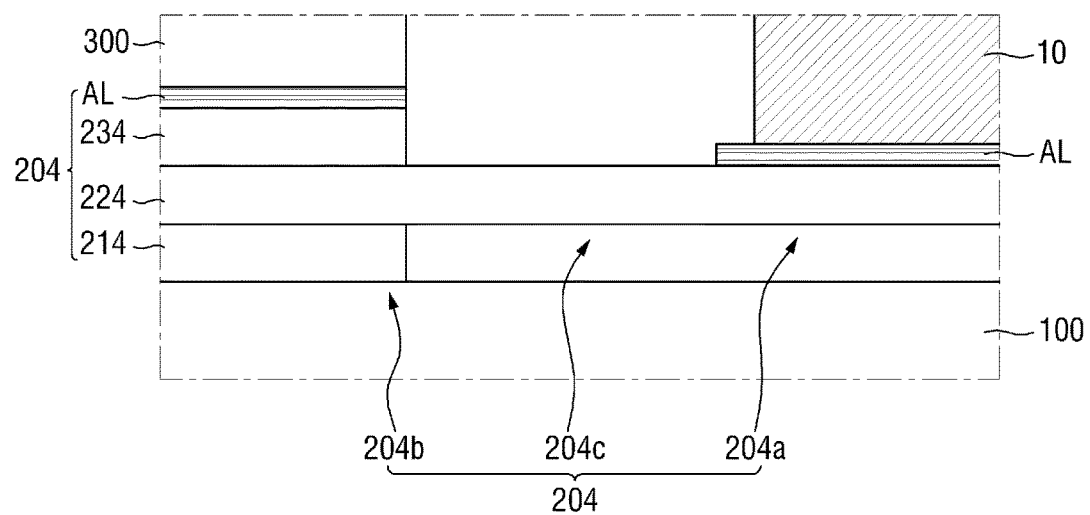
FIGS. 10, 11, 12, 13 and 14 are cross-sectional views of PCBs according to embodiments.

FIG. 10 is a cross-sectional view of a PCB 204 according to an embodiment. The PCB 204 of FIG. 10 is the same as that of FIG. 5 except that a first area 204a and a connecting portion 204c have the same thickness. Hereinafter, any redundant description will be omitted, and the current embodiment will be described, focusing mainly on differences with the pervious embodiment.

Referring to FIG. 10, a second area 204b of PCB 204 includes unit layers 214, 224 and 234, and the unit layer 224 extends up to a first area 204a to form the connecting portion 204c between the first area 204a and the second area 204b. That is, the first area. 204a formed by the unit layer 214 and the connecting portion 204c formed by the unit layer 214 may be integrated with each other. Accordingly, the thickness of the first area 204a and the thickness of the connecting portion 204c may be the same.

Since the first area 204a is as thin as the connecting portion 204c, a space is formed under the first area 204a. Therefore, the range in which the first area 204a can move downward is widened.

Figure 11:
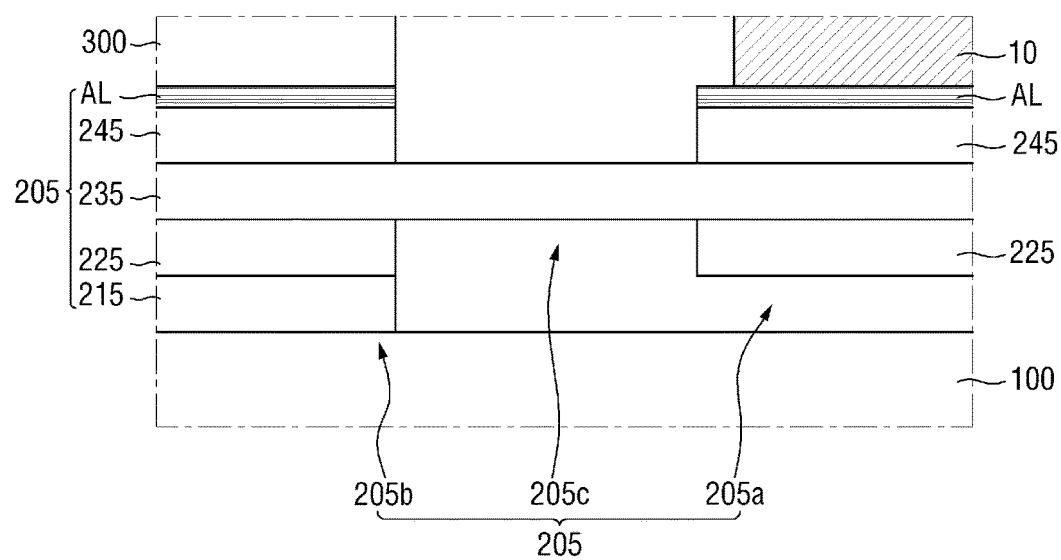

FIG. 11 is a cross-sectional view of a PCB 205 according to an embodiment. The PCB 205 of FIG. 11 is the same as that of FIG. 5 except that a first area 205a, a second area. 205b, and a connecting portion 205c have different thicknesses. Hereinafter, any redundant description will be omitted, and the current embodiment will be described, focusing mainly on differences with the pervious embodiment.

Referring to FIG. 11, the number of unit layers 225, 235 and 245 constituting the first area 205a of the PCB 205, the number of unit layers 215, 225, 235 and 245 constituting the second area 205b, and the number of unit layers 235 constituting the connecting portion 205c may be different from each other. Accordingly, the thicknesses of the first area 205a, the second area 205b, and the connecting portion 205c may all be different.

Since the first area 205a is thin, the range in which the first area 205a can move is widened due to a space formed under the first area 205a. In addition, since the first area 205a is thicker than the connecting portion 205c, it can secure certain rigidity.

Figure 12:
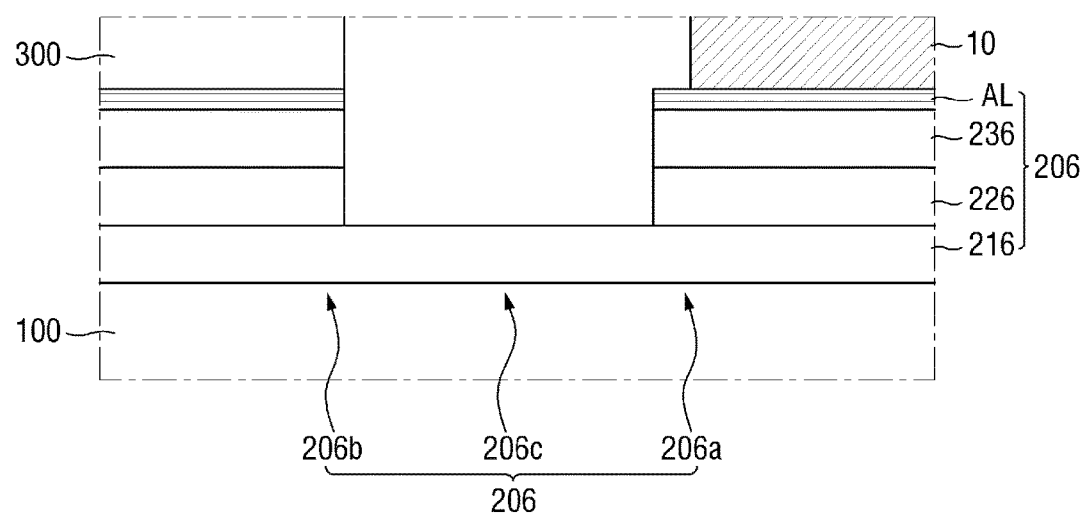
Figure 13:
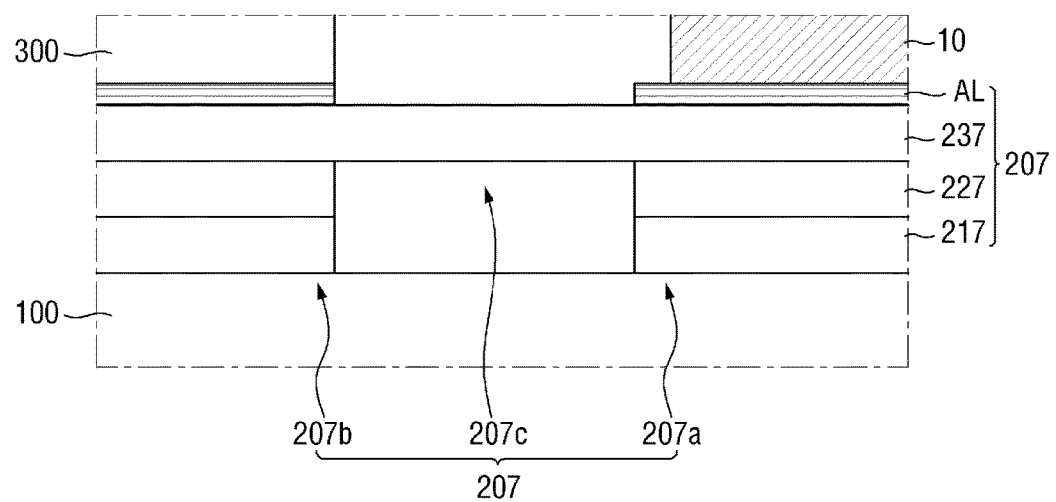

FIGS. 12 and 13 are cross-sectional views of PCBs 206 and 207 according to embodiments. The PCBs 206 and 207 of FIGS. 12 and 13 are the same as that of FIG. 5 except that a connecting portion 206c or 207c is disposed in a lower or higher part of the PCB 206 or 207. Hereinafter, any redundant description will be omitted, and the current embodiments will be described, focusing mainly on differences with the pervious embodiment.

Referring to FIG. 12, the connecting portion 206c may be formed by extending a lowermost layer 216 among unit layers 216, 226, and 236 of the PCB 206. Alternatively, referring to FIG. 13, the connecting portion 207c may be formed by extending an uppermost layer 237 among unit layers 217, 227 and 237 of the PCB 207.

As the connecting portion 206c is located lower, it may be advantageous for the downward movement of the first area 206a. Conversely, as the connecting portion 207c is located higher, it may be advantageous for the upward movement of the first area 207a.

Figure 14:
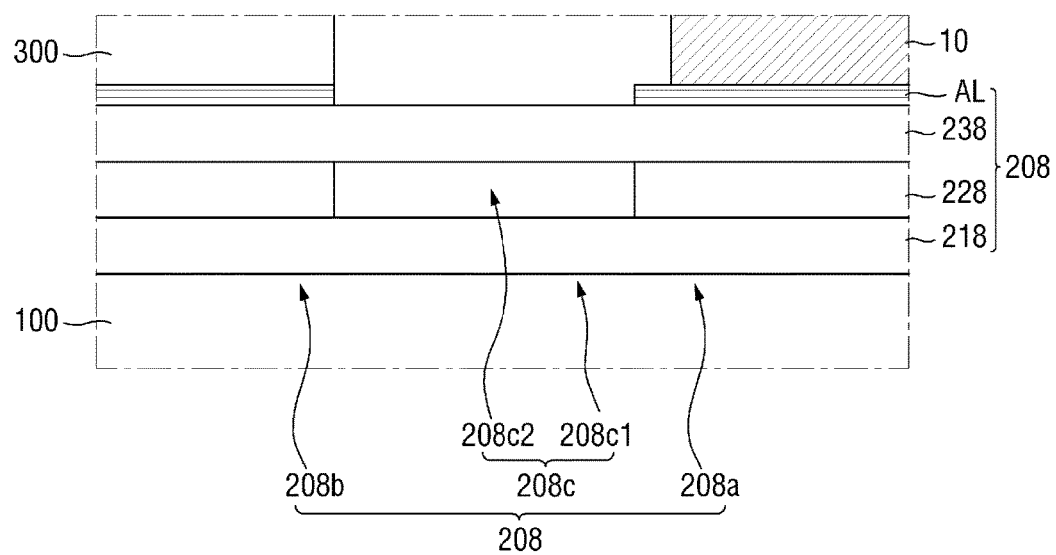

FIG. 14 is a cross-sectional view of a PCB 208 according to an embodiment. The PCB 208 of FIG. 14 is the same as that of FIG. 5 except that a connecting portion 208c includes a plurality of layers. Hereinafter, any redundant description will be omitted, and the current embodiment will be described, focusing mainly on differences with the pervious embodiment.

Referring to FIG. 14, the connecting portion 208c may be composed of a plurality of layers. Although a first unit layer 218 and a third unit layer 238 respectively form a first connecting layer 208c1 and a second connecting layer 208c2 in the drawing, the number and positions of layers constituting the connecting portion 208c are not limited to this case.

Since the connecting portion 208c is composed of a plurality of layers, even when some of the layers are damaged or cut off, the function of the connecting portion 208c can be sufficiently performed by the remaining layers.

Figure 15:
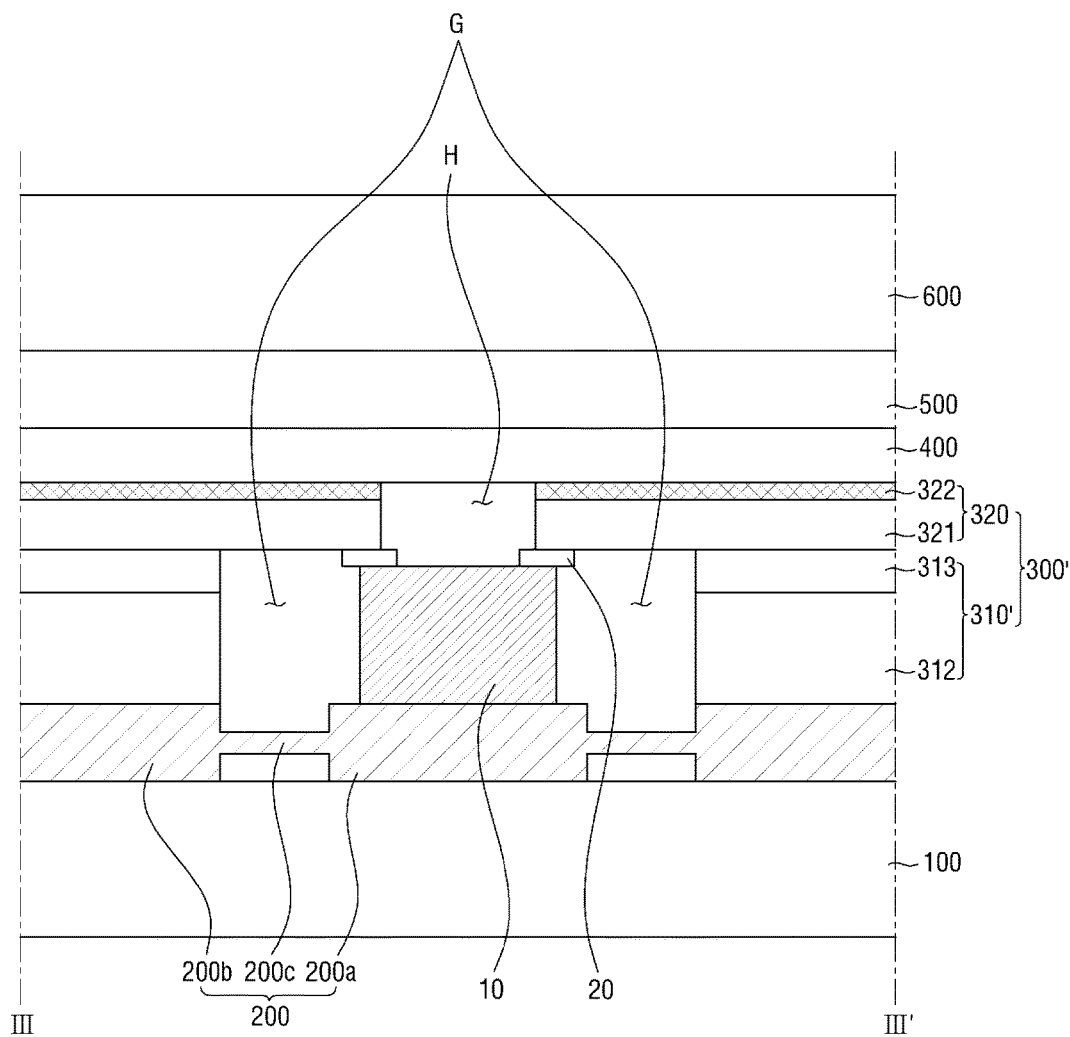
FIG. 15 is a cross-sectional view of an under-panel sheet according to an embodiment.

FIG. 15 is a cross-sectional view of an under-panel sheet 300' according to an embodiment. The under-panel sheet 300' of FIG. 15 is the same as that of FIG. 3 except that it does not include a spacer. Hereinafter, any redundant description will be omitted, and the current embodiment will be described, focusing mainly on differences with the pervious embodiment.

Referring to FIG. 15, a lower layer 310' of the under-panel sheet 300' may not include a spacer, unlike in FIG. 3. As described above, a first area 200a of a PCB 200 of the inventive concept on which a sensor 10 is disposed and a second area 200c on which the under-panel sheet 300' is disposed have independent mobility in the vertical direction. Therefore, a spacer for compensating a height difference between the sensor 10 and the under-panel sheet 300' can be omitted.

According to embodiments, a portion of a PCB on which a sensor is disposed and a portion of the PCB on which an under-panel sheet is disposed can independently move in the vertical direction. Therefore, a difference in weight due to a height difference between the sensor and the under-panel sheet can be reduced.

However, the effects of the embodiments are not restricted to the one set forth herein. The above and other effects of the embodiments will become more apparent to one of daily skill in the art to which the embodiments pertain by referencing the claims.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A display device comprising:
a printed circuit board (PCB);
an under-panel sheet which is disposed on the PCB, the under-panel sheet including a main portion and a groove recessed from a surface facing the PCB toward an opposite surface; and
a sensor which is disposed on the PCB in the groove,
wherein the PCB includes a first area on which the sensor is disposed, a second area surrounding the first area and a connecting portion disposed between the first area and the second area, the connecting portion including at least one opening.

2. The display device of claim 1, wherein the sensor is an optical sensor, and a through hole disposed on the sensor is further defined in the under-panel sheet.

3. The display device of claim 2, wherein the sensor is an optical fingerprint sensor.

4. The display device of claim 1, further comprising an adhesive member which is disposed between the sensor and the main portion, and contacts the sensor and the main portion.

5. The display device of claim 1, wherein the sensor and the main portion are attached to the first area and the second area, respectively.

6. The display device of claim 1, wherein the PCB is a flexible PCB (FPCB).

7. The display device of claim 6, further comprising a display panel which is disposed on the under-panel sheet, wherein the PCB extends further outward than the under-panel sheet and is bent such that an end of the PCB is connected to the display panel.

8. A display device comprising:
a PCB;
an under-panel sheet which is disposed on the PCB, the under-panel sheet including a groove recessed from a surface facing the PCB toward an opposite surface;
a display panel which is disposed on the under-panel sheet; and
a sensor which is disposed on the PCB in the groove,
wherein the PCB comprises, in plan view:
a first area on which the sensor is disposed;
a second area surrounding the first area; and
a connecting portion which is disposed between the first area and the second area, the connecting portion being thinner than the first area and/or the second area.

9. The display device of claim 8, wherein the connecting portion includes at least one opening.

10. The display device of claim 8, wherein the connecting portion are integrated with at least part of each of the first area and the second area.

11. The display device of claim 8, wherein the sensor is an optical sensor, and a through hole disposed on the sensor is further defined in the under-panel sheet.

12. The display device of claim 8, wherein the PCB comprises one or more signal lines which pass through the first area and the connecting portion.

13. A display device comprising:
a PCB including a first area, a second area surrounding the first area, and a connecting portion disposed between the first area and the second area;
a sensor which is disposed on the first area; and
an under-panel sheet which is disposed on the PCB, the under-panel sheet including a groove disposed on the first area to receive the sensor,
wherein the connecting portions are thinner than the first area and/or the second area.

14. The display device of claim 13, wherein the connecting portion includes at least one opening.

15. The display device of claim 14, wherein the PCB has a structure in which one or more unit layers containing copper are stacked, wherein the number of the unit layers included in the connecting portion is smaller than that of the unit layers included in the first area and/or the second area.

16. The display device of claim 13, wherein the connecting portion is integrated with at least part of each of the first area and the second area.

17. The display device of claim 16, wherein the PCB has a structure in which one or more unit layers containing copper are stacked, wherein at least one of the unit layers included in the connecting portion is integrated with at least one of the unit layers included in each of the first and second areas.

18. The display device of claim 13, wherein the sensor is an optical sensor, and a through hole disposed on the sensor is further defined in the under-panel sheet.

19. The display device of claim 13, wherein the PCB is an FPCB.

20. The display device of claim 19, further comprising a display panel which is disposed on the under-panel sheet, wherein the PCB extends further outward than the under-panel sheet and is bent such that an end of the PCB is connected to the display panel.

* * * * *